(12) United States Patent
Liu et al.

(10) Patent No.: US 12,500,092 B2
(45) Date of Patent: *Dec. 16, 2025

(54) CHIP PACKAGE STRUCTURE AND METHOD FOR FABRICATING THE SAME

(71) Applicant: TONG HSING ELECTRONIC INDUSTRIES, LTD., Taipei (TW)

(72) Inventors: Dei-Cheng Liu, Taipei (TW); Chia-Shuai Chang, Hsin-Chu County (TW); Ming-Yen Pan, Taipei (TW); Jian-Yu Shih, Taipei (TW); Jhih-Wei Lai, Taipei (TW); Shih-Han Wu, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 479 days.

This patent is subject to a terminal disclaimer.

(21) Appl. No.: 18/073,626

(22) Filed: Dec. 2, 2022

(65) Prior Publication Data
US 2024/0071776 A1   Feb. 29, 2024

(30) Foreign Application Priority Data
Aug. 25, 2022 (TW) .................................. 111131968

(51) Int. Cl.
*H10F 39/00* (2025.01)
*H01L 21/48* (2006.01)
(Continued)

(52) U.S. Cl.
CPC .......... *H01L 21/481* (2013.01); *H01L 21/486* (2013.01); *H01L 21/50* (2013.01);
(Continued)

(58) Field of Classification Search
CPC ..... H01L 21/481; H01L 21/486; H01L 21/50; H10F 39/804; H10H 20/8506;
(Continued)

(56) References Cited

U.S. PATENT DOCUMENTS

| 9,985,191 B2 * | 5/2018 | Chiu ................. H10H 20/8506 |
| 10,374,104 B2 | 8/2019 | Ru et al. |

(Continued)

FOREIGN PATENT DOCUMENTS

| CN | 211683519 U | * | 10/2020 | |
| KR | 101778395 B1 | * | 9/2017 | .......... H01L 23/488 |

(Continued)

OTHER PUBLICATIONS

Machine translation CN 111438941 (Year: 2020).*
Machine translation KR 101778395 (Year: 2017).*

*Primary Examiner* — Christine S. Kim
*Assistant Examiner* — Nathalie R Fayette
(74) *Attorney, Agent, or Firm* — Li & Cai Intellectual Property (USA) Office

(57) ABSTRACT

A chip packaging structure and a method for fabricating the same are provided. The chip package structure includes a conductive substrate, a dam and a metal shielding layer. The conductive substrate includes a substrate, vias and electrodes. The substrate has first and second board surfaces opposite to each other. The vias penetrate through the first board surface and the second board surface, and a part of the vias is disposed in a first die-bonding region on which a chip is to be arranged. The electrodes extend from the first board surface to the second board surface through the vias. The dam is formed on the first board surface to surround the first die-bonding region, and the dam has a height higher than that of the chip. The metal shielding layer covers the dam and a part of the first board surface that do not overlap with the electrodes.

7 Claims, 17 Drawing Sheets

(51) Int. Cl.
  *H01L 21/50*    (2006.01)
  *H10H 20/85*    (2025.01)
  *H10H 20/856*   (2025.01)
  *H10H 20/857*   (2025.01)
  *H10H 20/01*    (2025.01)

(52) U.S. Cl.
  CPC ....... *H10F 39/804* (2025.01); *H10H 20/8506* (2025.01); *H10H 20/856* (2025.01); *H10H 20/857* (2025.01); *H10H 20/0363* (2025.01); *H10H 20/0364* (2025.01)

(58) Field of Classification Search
  CPC .............. H10H 20/856; H10H 20/857; H10H 20/0363; H10H 20/0364
  See application file for complete search history.

(56) References Cited

U.S. PATENT DOCUMENTS

| | | | |
|---|---|---|---|
| 2020/0135991 A1* | 4/2020 | Lin | ............... H10H 20/852 |
| 2020/0395517 A1 | 12/2020 | Tsai et al. | |
| 2024/0088049 A1* | 3/2024 | Liu | ............... H01L 24/16 |

FOREIGN PATENT DOCUMENTS

| | | |
|---|---|---|
| TW | M527615 U | 8/2016 |
| WO | WO 2009008210 A1 | 1/2009 |

* cited by examiner

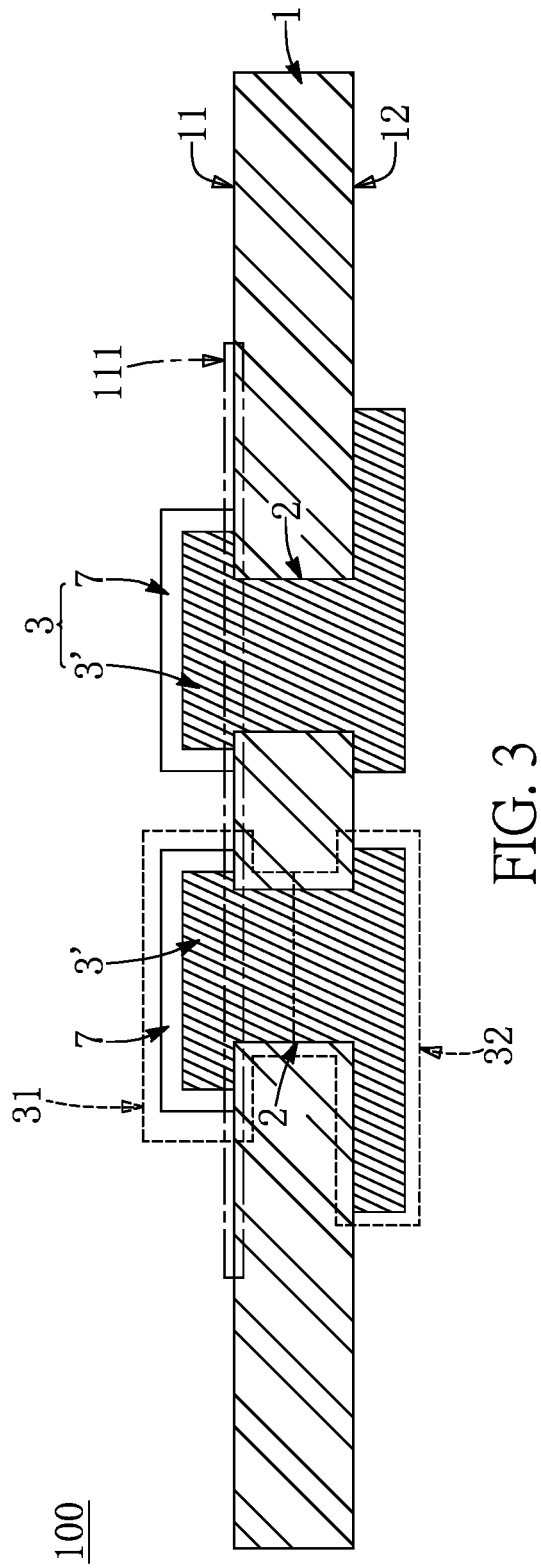
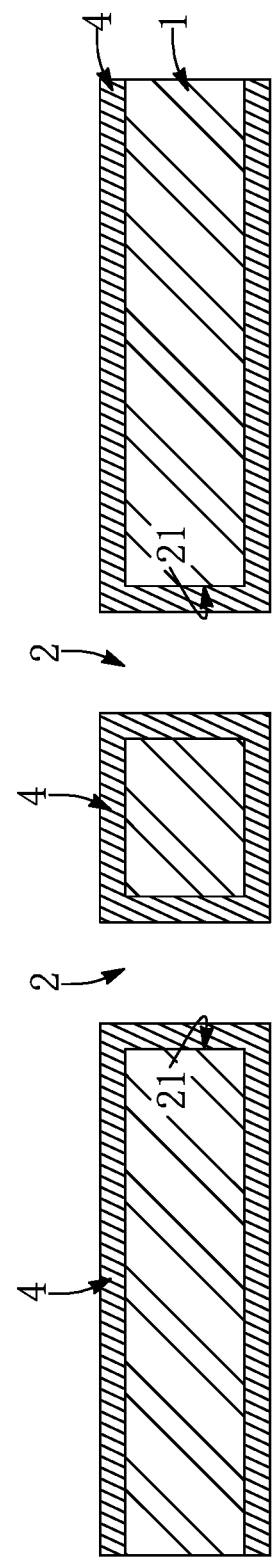
FIG. 3
FIG. 4

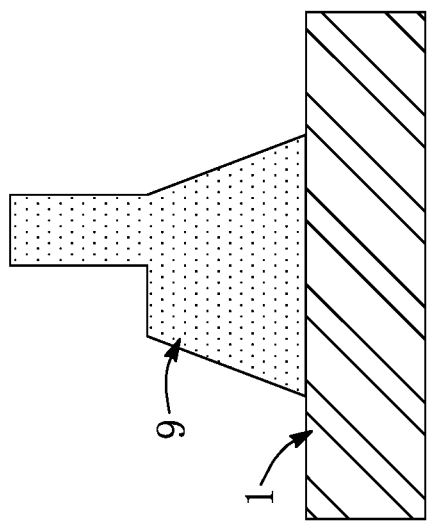
FIG. 11A
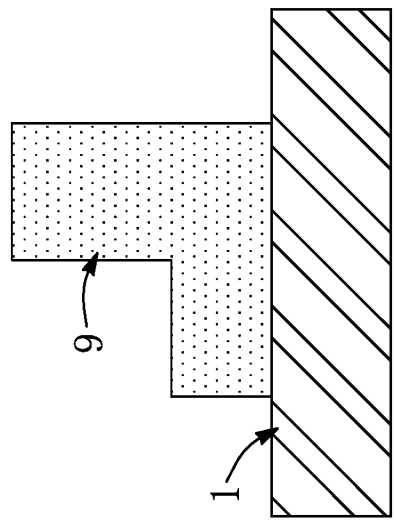
FIG. 11B
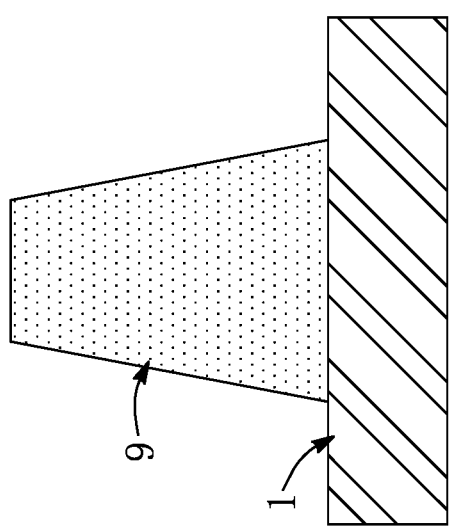
FIG. 11C
FIG. 11D

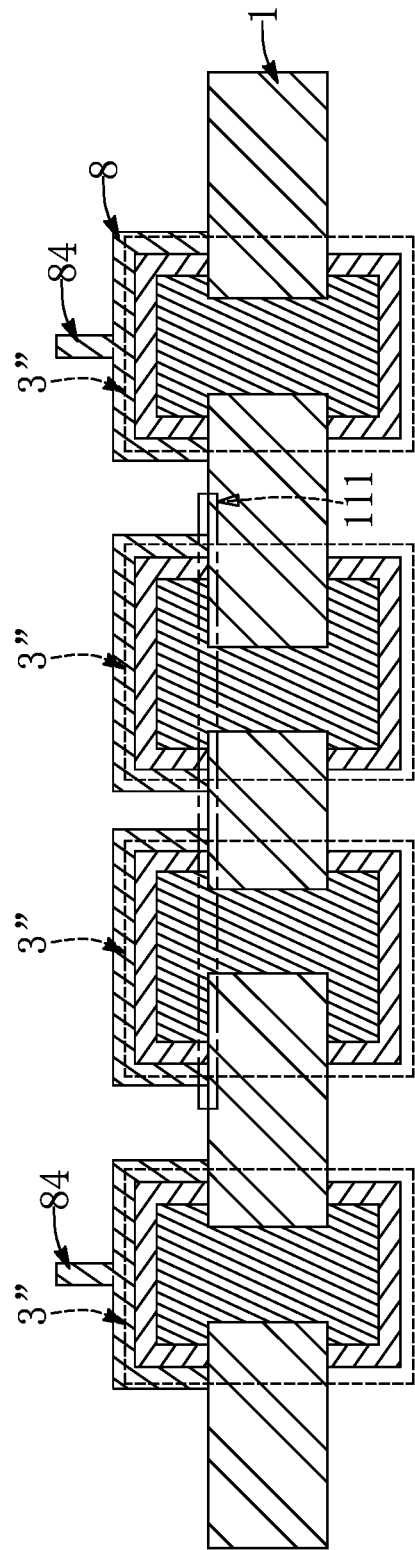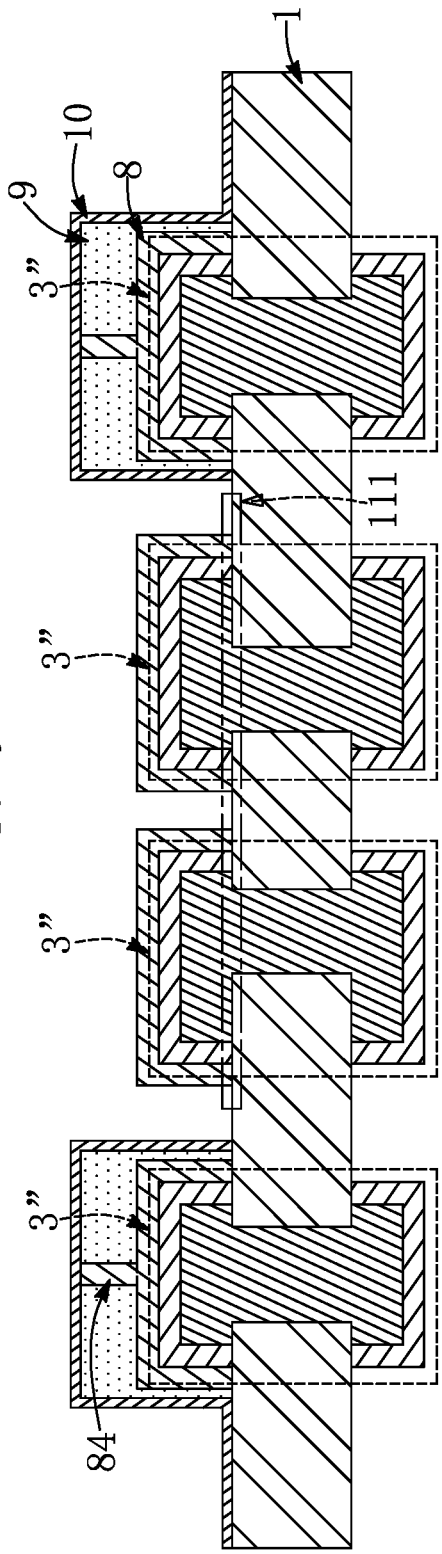

CHIP PACKAGE STRUCTURE AND METHOD FOR FABRICATING THE SAME

CROSS-REFERENCE TO RELATED PATENT APPLICATION

This application claims the benefit of priority to Taiwan Patent Application No. 111131968, filed on Aug. 25, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure and a method for fabricating the same, and more particularly to a chip package structure and a method for fabricating the same that integrate processes of three-dimensional printing and substrate metallization.

BACKGROUND OF THE DISCLOSURE

In the existing package structure, molded cavities are often used to make adjustments for various product specifications. However, in order to form cavities with different specifications, different molds need to be provided in the molding process, which is expensive and µme consuming.

In addition, lots of complex processes may be involved before the production of the cavities is complete, including application of dry film or wet photoresist, lithography, electroplating, sputtering or vapor deposition of metal layers, etching of metal wires, and the like, steps of which are not only complicated, but also difficult to perform. Furthermore, limitations on the aspect ratio and issues relating to structural integrity also need to be considered to avoid collapsing of the cavity when the package structure is encapsulated with adhesives.

Therefore, improving the structure and process of the package structure has become one of the important issues to be addressed in the art.

SUMMARY OF THE DISCLOSURE

In response to the above-referenced technical inadequacies, the present disclosure provides a chip package structure that integrates three-dimensional printing and substrate metallization processes and a method for fabricating the same.

In one aspect, the present disclosure provides a method for fabricating a chip package structure, and the method includes: providing a conductive substrate, in which the conductive substrate includes a substrate having a first board surface and a second board surface opposite to each other, a plurality of vias penetrating through the first board surface and the second board surface, in which at least a part of the plurality of vias is disposed in a first die-bonding region for arranging a chip, and a plurality of electrodes extending from the first board surface to the second board surface through the plurality of vias, in which each of the plurality of electrodes includes an upper electrode portion and a lower electrode portion, the upper electrode part covers the first board surface, and the lower electrode partially covers the second board surface; performing a first deposition process to deposit a first metal seed layer on the first board surface and the plurality of electrodes; performing a first lithography process to cover a first photoresist layer on the first seed layer, such that the first photoresist layer overlaps with the first die-bonding region; performing a first etching process to remove a to-be-etched portion of the first metal seed layer that is not covered by the first photoresist layer; performing a three-dimensional (3D) printing-molding process to form at least one dam surrounding the first die-bonding region with a 3D printing material on the first board surface, in which the at least one dam has a height higher than a height of the chip; performing a second deposition process to deposit and cover a metal shielding layer on the first plate surface, the at least one dam and the first photoresist layer; performing a photoresist removal process to remove the first photoresist layer and a portion of the metal shielding layer that overlaps with the first photoresist layer; and performing a second etching process to remove the first metal seed layer to form the chip package structure.

In another aspect, the present disclosure provides a chip package structure, which includes a conductive substrate, at least one dam and a metal shielding layer. The conductive substrate includes a substrate, a plurality of vias and a plurality of electrodes. The substrate has a first board surface and a second board surface opposite to each other. The plurality of vias penetrate through the first board surface and the second board surface, and at least a part of the plurality of vias is disposed in a first die-bonding region for arranging a chip. The plurality of electrodes extend from the first board surface to the second board surface through the plurality of vias, each of the plurality of electrodes includes an upper electrode portion and a lower electrode portion, the upper electrode part covers the first board surface, and the lower electrode partially covers the second board surface. The at least one dam is formed to surround the first die-bonding region and formed on the first board surface, and the at least one dam has a height higher than a height of the chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 3 is a schematic diagram of the conductive substrate according to the first embodiment of the present disclosure;

FIG. 4 is a schematic diagram showing a process of step S101 according to the first embodiment of the present disclosure;

FIGS. 11A to 11D are schematic views of various cross-sections of the dam according to the first embodiment of the present disclosure;

FIG. 19 is a schematic diagram of processes of steps S111 and S112 according to the second embodiment of the present disclosure;

FIG. 20 is a schematic diagram showing a process after steps S12 to S17 are performed according to the second embodiment of the present disclosure;

DETAILED DESCRIPTION OF THE EXEMPLARY EMBODIMENTS

Figure 1:
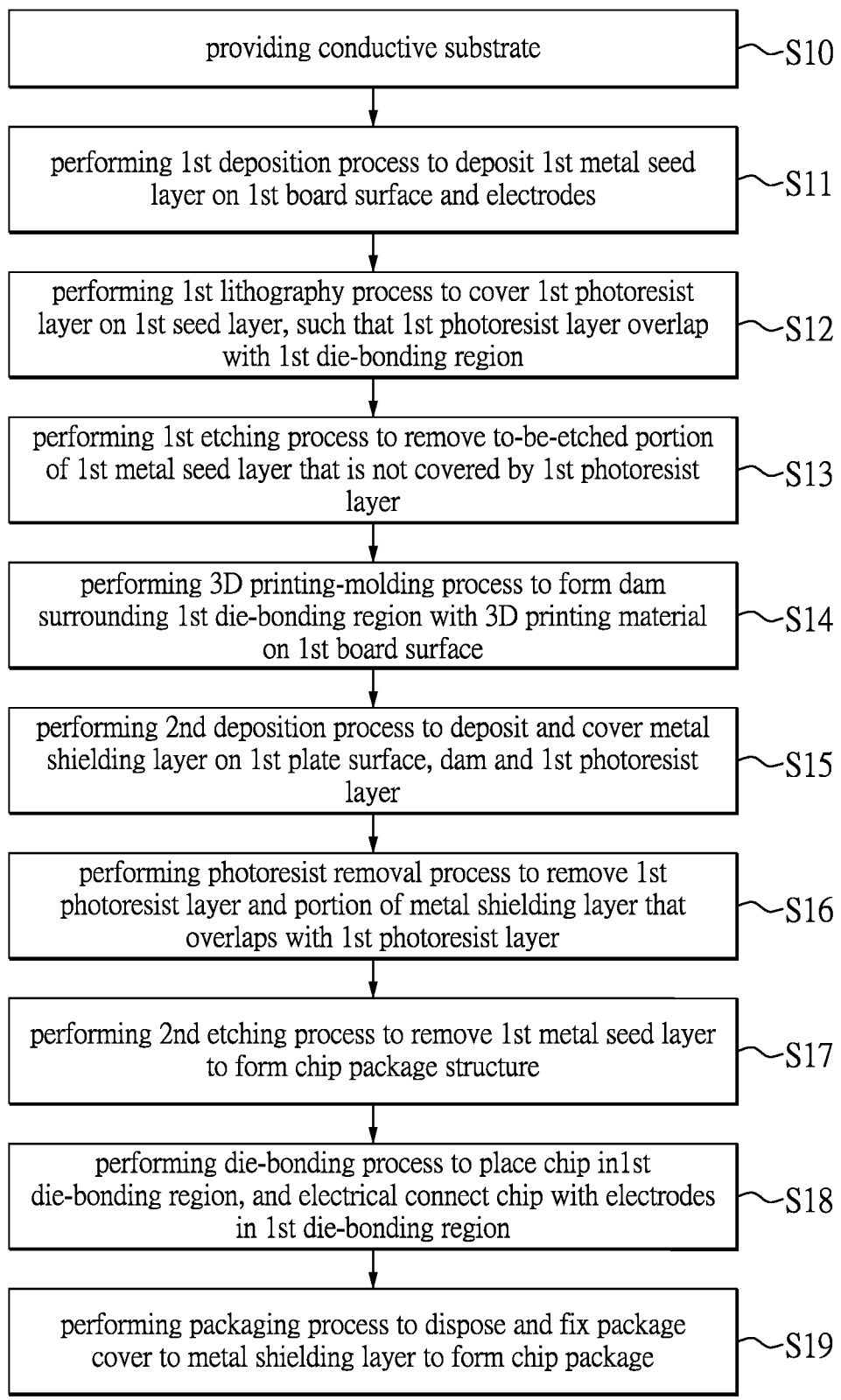
FIG. 1 is a flowchart of a method for fabricating a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
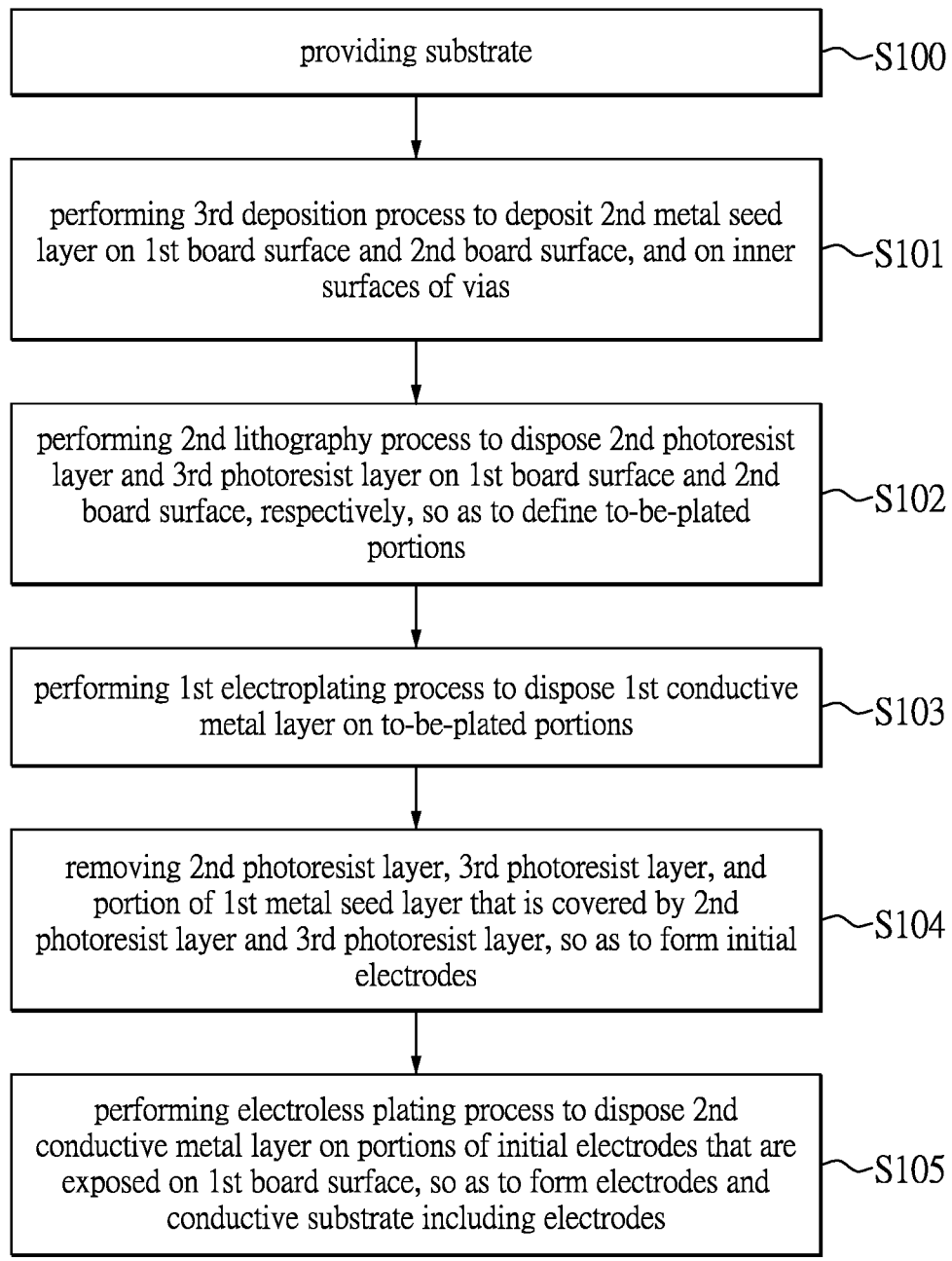
FIG. 2 is a flowchart showing steps for forming a conductive substrate according to the first embodiment of the present disclosure.

FIG. 1 is a flowchart of a method for fabricating a chip package structure according to a first embodiment of the present disclosure. FIG. 2 is a flowchart showing steps for forming a conductive substrate according to the first embodiment of the present disclosure.

Reference is made to FIG. 1, one aspect of the present disclosure is to provide a method for fabricating a chip package structure, and the method includes the following steps:

Step S10: providing a conductive substrate.

FIG. 3 is a schematic diagram of the conductive substrate according to the first embodiment of the present disclosure. Referring to FIG. 3, the conductive substrate 100 includes a substrate 1, a plurality of vias 2 and a plurality of electrodes 3. The substrate 1 can be, for example, a ceramic substrate made of aluminum oxide or aluminum nitride, and has a first board surface 11 and a second board surface 12 opposite to each other. The plurality of vias 2 penetrate through the first board surface 11 and the second board surface 12, and at least a part of the plurality of vias 2 is disposed in a first die-bonding region 111 for arranging a chip.

The plurality of electrodes 3 are extended from the first board surface 11 to the second board surface 12 through the plurality of vias 2, respectively. Each of the plurality of electrodes 3 includes an upper electrode portion 31 and a lower electrode portion 32, the upper electrode portion 31 covers a portion of the first board surface 11, and the lower electrode part 32 covers a portion of the second board surface 12.

Before performing step S10, the following steps for forming the conductive substrate 100 are first described. However, in the present disclosure, it is not limited to fabricate the conductive substrate in this way.

Reference is made to FIG. 2, the manufacturing method provided by the present disclosure can include the following steps for forming the conductive substrate 100:

Step S100: providing a substrate.

Step S101: performing a third deposition process to deposit a second metal seed layer on the first board surface and the second board surface, and on inner surfaces of the plurality of vias. Reference is made to FIG. 4, which is a schematic diagram showing a process of step S101 according to the first embodiment of the present disclosure. As shown in FIG. 4, the vias 2 can be formed on the (ceramic) substrate 1 by using a laser drilling process, and the third deposition process can be, for example, vacuum evaporation, ion plating, or sputtering process, so as to deposit a second metal seed layer 4 on surfaces of the substrate 1 and on the inner surfaces 21 of the vias 2. The second metal seed layer 4 can be, for example, a conductive metal seed layer, such as a copper seed layer, which can be used to provide a suitable conductive layer in subsequent electroplating processes. It should be noted that the so-called third deposition process refers to being separated from first and second deposition processes described hereinafter, and is not intent to limit a sequence of the processes to be performed with.

Step S102: performing a second lithography process to dispose a second photoresist layer and a third photoresist layer on the first board surface and the second board surface, respectively, so as to define a plurality of to-be-plated portions.

Step S103: performing a first electroplating process to dispose a first conductive metal layer on the plurality of to-be-plated portions.

Figure 5:
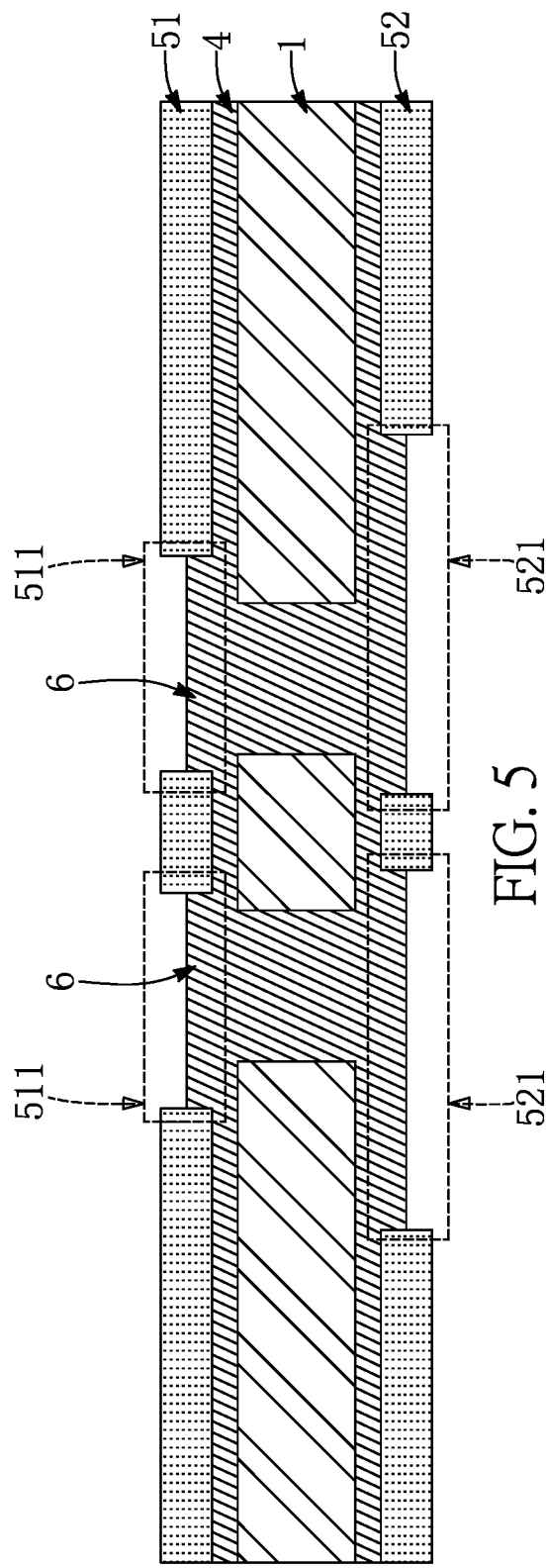
FIG. 5 is a schematic diagram showing processes of steps S102 and S103 according to the first embodiment of the present disclosure.

FIG. 5 is a schematic diagram showing processes of steps S102 and S103 according to the first embodiment of the present disclosure. As shown in FIG. 5, the above steps are used to metallize the substrate 1 to form electrodes for the chip formed in subsequent steps. Therefore, in step S102, a photoresist layer can be exposed and developed to carve geometric pattern structures on the photoresist layer, so as to form a photoresist layer 51 and a photoresist layer 52 as shown in FIG. 5.

It should be noted that the photoresist layer 51 is disposed on the first board surface 11 to define a to-be-plated portion 511 where the upper electrode portions 31 of the electrodes 3 are to be formed, and the photoresist layer 52 is disposed on the second board surface 12 to define a to-be-plated portion 521 where the lower electrode portions 32 of the electrodes 3 are to be formed. The electroplating process is then performed to form a conductive metal layer 6 on the surfaces of the substrate 1 and the inner surfaces 21 of the vias 2 on which the second metal seed layer 4 has been formed. It should be noted that the first conductive metal layer 6 is made of a conductive metal material that is the same as that of the second metal seed layer 4, so there is no obvious layered structure. However, the above is merely an example, and is not meant to limit the scope of the present disclosure. In other words, the first conductive metal layer 6 can also use a conductive metal material different from that of the second metal seed layer 4.

Step S104: removing the second photoresist layer, the third photoresist layer, and a portion of the first metal seed layer that is covered by the second photoresist layer and the third photoresist layer, so as to form a plurality of initial electrodes.

Figure 6:
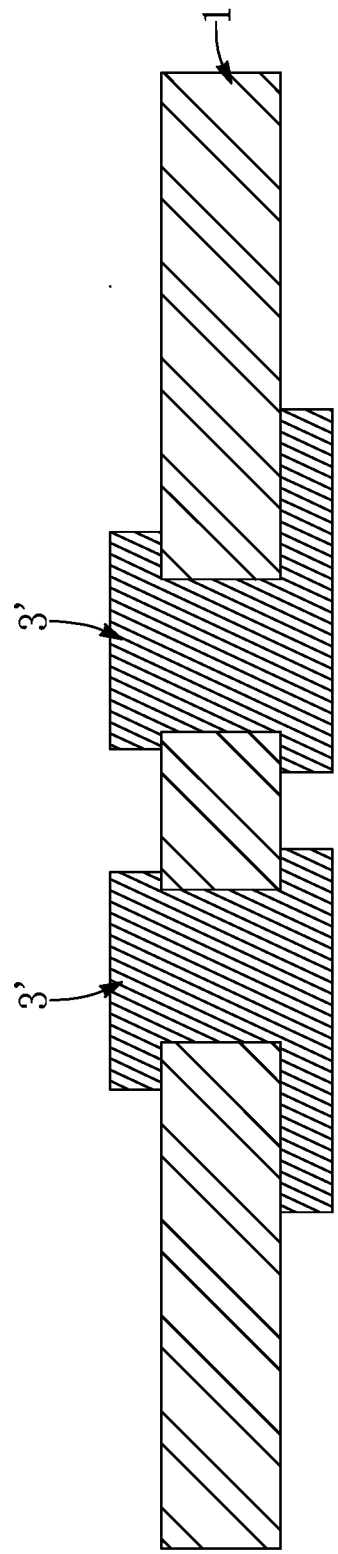
FIG. 6 is a schematic diagram showing a process of step S104 according to the first embodiment of the present disclosure.

FIG. 6 is a schematic diagram showing a process of step S104 according to the first embodiment of the present disclosure. As shown in FIG. 6, the photoresist layers 51, 52 and the first metal seed layer 4 in FIG. 5 can be removed by etching and photoresist removal processes to form portions covered by the photoresist layers 51, 52, so as to form initial electrodes 3' in FIG. 6. It should be noted that the initial electrodes 3' are formed by the first conductive metal layer 6 and the second metal seed layer 4.

Step S105: performing an electroless plating process to dispose a second conductive metal layer on portions of the plurality of initial electrodes that are exposed on the first board surface, so as to form the plurality of electrodes and the conductive substrate including the plurality of electrodes. It should be noted that the so-called electroless plating is also called the chemical plating, which is a surface treatment process for depositing alloys on a surface of a substrate body using an autocatalytic reaction, which is different from the electroplating process mentioned in the above step S103.

Reference is made to FIG. 3 again, the second conductive metal layer 7 can be formed on a portion of the initial electrode 3' that is exposed and covers the first board surface 11. Therefore, the second conductive metal layer 7 and the initial electrodes 3' exposed on the first board surface 11 can collectively form the upper electrode portions 31 of the electrodes 3. It should be noted that the second conductive metal layer 7 can include a first metal layer on a surface of the initial electrode 3' and a second metal layer on the first metal layer, and the first and second metal layers can be a metal composite layer composed of nickel/gold in sequence. The gold layer can be used to prevent an oxidation of the nickel layer to improve durability of the electrode 3. In one embodiment of the present disclosure, a preferred thickness of the first metal layer is 5 μm, and a preferred thickness of the second metal layer is 0.025 μm.

Reference is made to FIG. 1 again, the method proceeds to step S11: performing a first deposition process to deposit a first metal seed layer on the first board surface and the plurality of electrodes.

Figure 7:
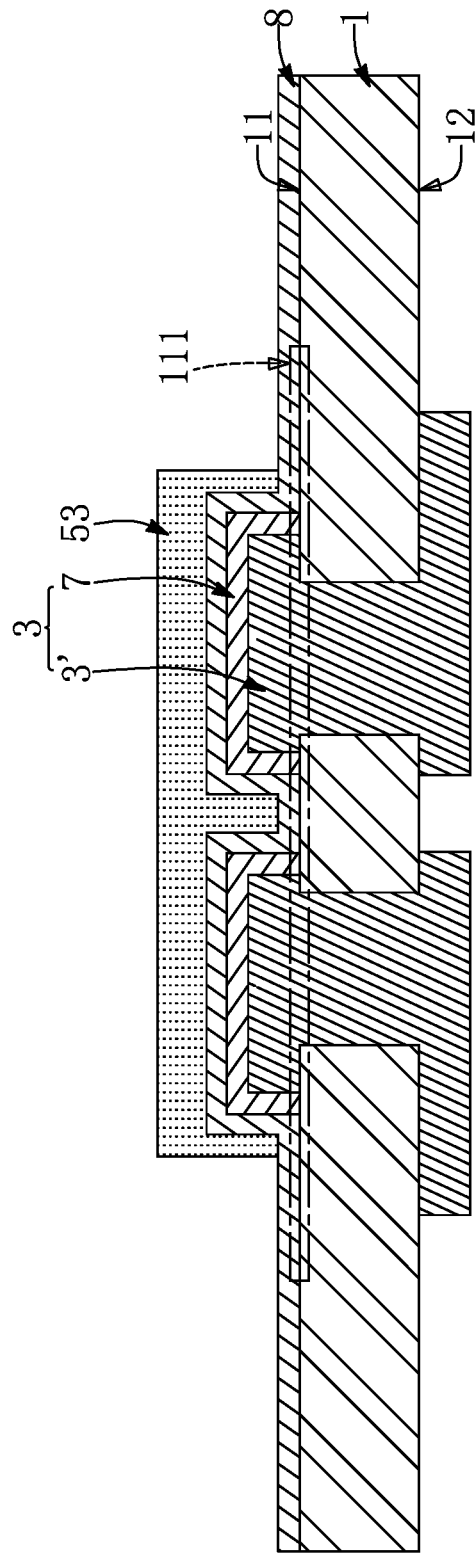
FIG. 7 is a schematic diagram showing processes of steps S11 and S12 according to the first embodiment of the present disclosure.

FIG. 7 is a schematic diagram showing processes of steps S11 and S12 according to the first embodiment of the present disclosure. As shown in FIG. 7, similar to the third deposition process, the first deposition process can be performed to deposit a first metal seed layer 8 on the first surface 11 of the (ceramic) substrate 1 and the electrodes by, for example, vacuum evaporation, ion plating, or sputtering process. The first metal seed layer 8 can be, for example, a conductive metal seed layer, such as a copper seed layer, which can be used to provide proper protection for the electrodes 3 in subsequent processes.

Step S12: performing a first lithography process to cover a first photoresist layer on the first seed layer, such that the first photoresist layer overlap with the first die-bonding region.

As shown in FIG. 7, in step S12, a photoresist layer can be first exposed and developed to carve a geometric figure structure on the photoresist layer to form the photoresist layer 53 shown in FIG. 7. The photoresist layer 53 is disposed on the first board surface 11, and is also formed for the purpose of protecting the electrodes 3 in the subsequent processes.

Step S13: performing a first etching process to remove a to-be-etched portion of the first metal seed layer that is not covered by the first photoresist layer.

Figure 8:
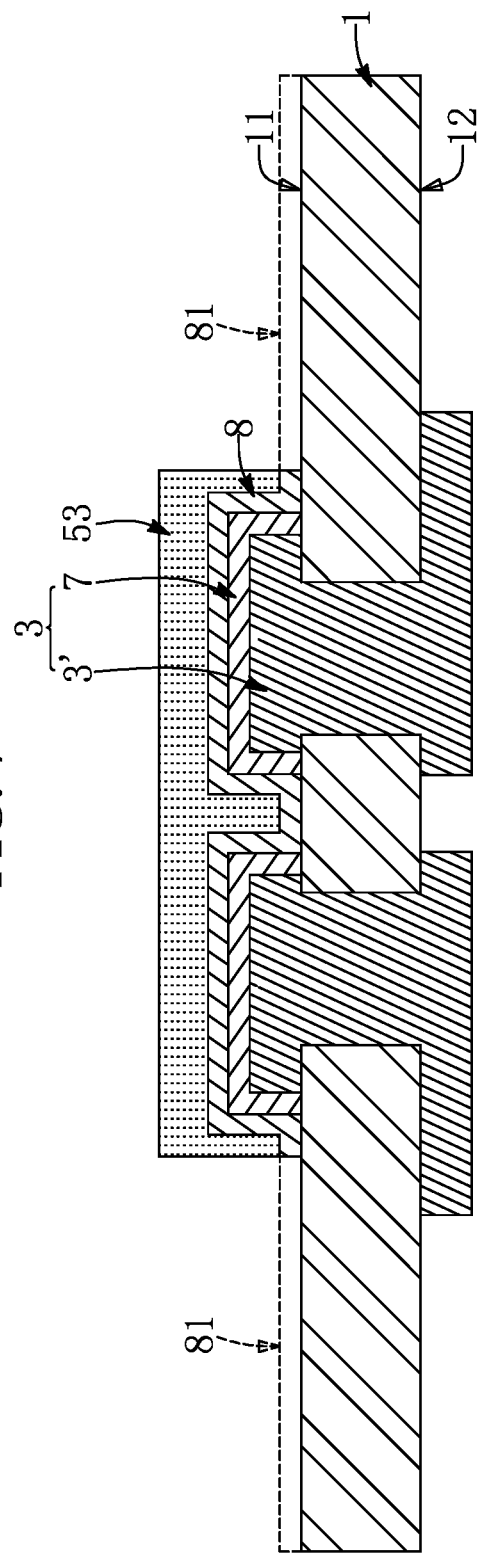
FIG. 8 is a schematic diagram of the process of step S13 according to the first embodiment of the present disclosure.

Reference is made to FIG. 8, which is a schematic diagram of the process of step S13 according to the first embodiment of the present disclosure. As shown in FIG. 8, in step S13, a to-be-etched portion 81 of the first metal seed layer 8 that is not covered by the photoresist layer 53 can be removed, so as to expose a portion of the first board surface 11 to serve as a reserved area for a dam formed in subsequent steps.

Step S14: performing a three-dimensional (3D) printing-molding process to form at least one dam surrounding the first die-bonding region with a 3D printing material on the first board surface. In detail, in order to form a cavity for packaging, a dam 6 is formed to surround the first die-bonding region 111 and has a height higher than that of a chip to be disposed in the first die-bonding region 111.

It should be noted that the 3D printing process in this step includes a 3D printing process and a light curing process. The 3D printing process utilizes a printing principle similar to that of an inkjet printer. A photosensitive resin or silicone material is sprayed on a printing area through a nozzle, and then irradiated and pre-cured by ultraviolet (UV) light. In this way, 3D printed material layers are stacked and shaped repeatedly, and are finally heat-cured to enhance structural reliability. Due to the smooth and delicate surface of the finished product, light curing technology is suitable for making high-precision and complex objects, so it is suitable for packaging technology.

Figure 9:
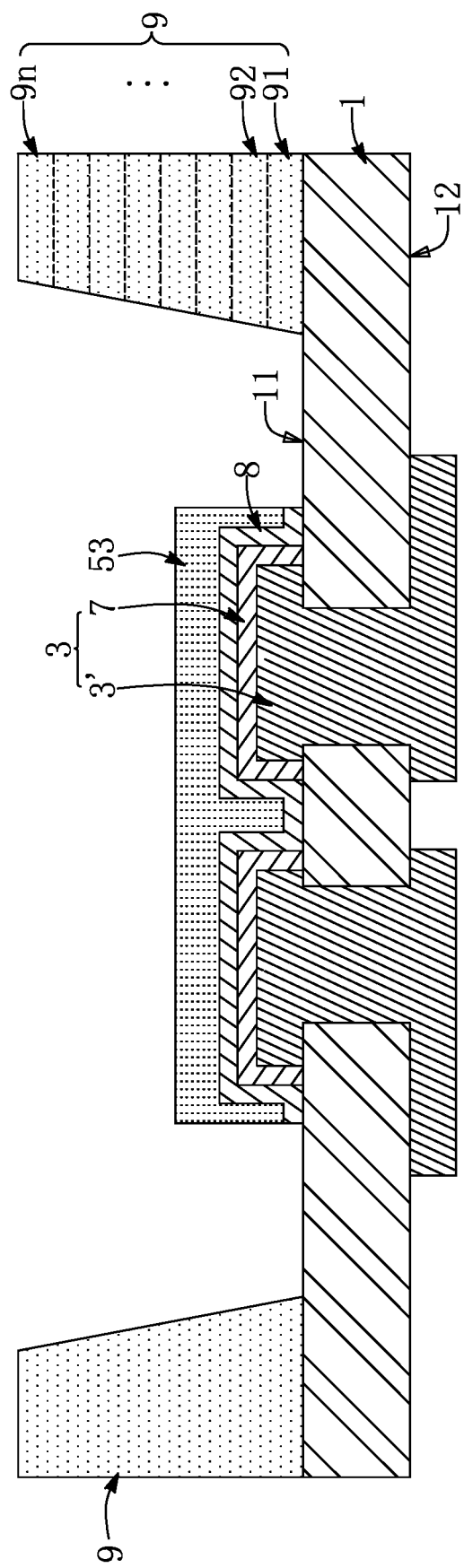
FIG. 9 is a schematic diagram showing a process of step S14 according to the first embodiment of the present disclosure.
Figure 10:
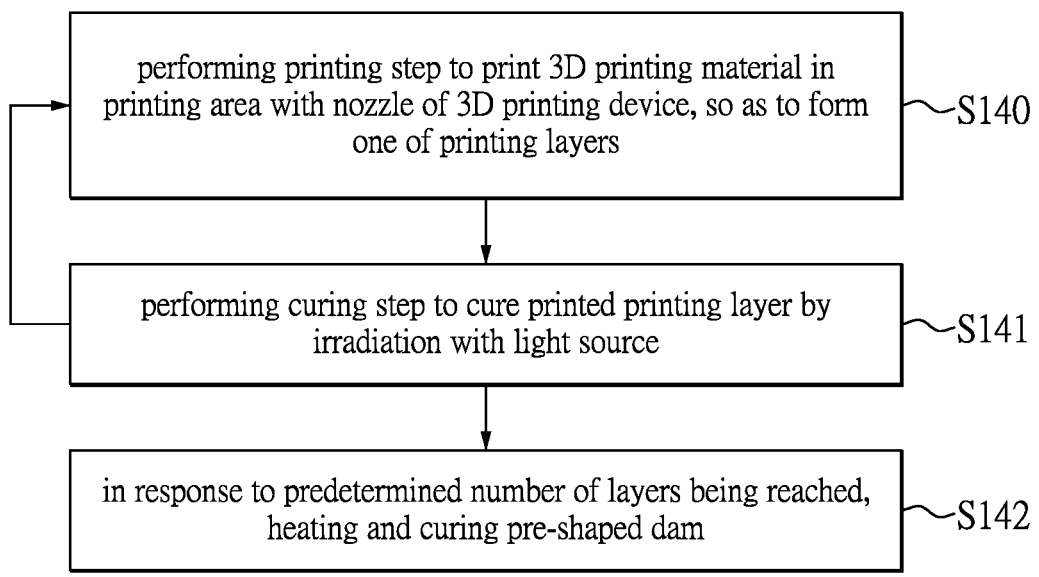
FIG. 10 is a flowchart showing steps for forming a dam according to the first embodiment of the present disclosure.

Reference is made to FIGS. 9 and 10, FIG. 9 is a schematic diagram showing a process of step S14 according to the first embodiment of the present disclosure, and FIG. 10 is a flowchart showing steps for forming a dam according to the first embodiment of the present disclosure.

As shown in FIG. 10, a dam 9 can include a plurality of printing layers 91, 92, . . . , 9n, and the step of performing the 3D printing-molding process to form the dam 9 further includes the following steps:

Step S140: performing a printing step to print the 3D printing material in a printing area with a nozzle of a 3D printing device, so as to form one of the plurality of printing layers.

Step S141: performing a curing step to cure the printed printing layer by irradiation with a light source.

Next, the printing step S140 and the curing step S141 are repeatedly performed to form the pre-shaped dam 9.

Step S142: in response to a predetermined number of layers being reached, heating and curing the pre-shaped dam.

For example, as shown in FIG. 9, the printing layer 91 can be formed first by using the nozzle of the 3D printing equipment, the printing layer 91 is pre-cured by irradiating the printing layer 91 with the UV light source, and then the same steps are performed for the printing layer 92 until a desired dam structure is achieved. For example, after the printing layer 9n is formed as the last layer, the overall pre-shaped dam 9 is heated and cured. It should be noted that, from a top view, each of the printing layers 91, 92, . . . , 9n is formed to surround the first die-bonding region 111 at a center of the first board surface 11. Therefore, by using a layer-by-layer stacking method, compared with the dispensing method used in the existing packaging technology, not only the collapse issues can be avoided, but also a cross-sectional shape of the dam 9 can be precisely controlled to make it closer to a target shape.

It is worth noting that a distance between the dam 9 and the first die-bonding region 111 only needs to be kept at least 100 μm, so as to prevent the 3D printing material used during the 3D printing process from being sprayed into the first die-bonding region 111. That is, a distance between the first die-bonding region 111 and a vertical projection of the dam 9 projected onto the first board surface 11 is at least greater than 100 μm. In addition, when the substrate 1 is made of materials such as AlN or $Al_2O_3$, under the same exposure energy, since AlN or $Al_2O_3$ has high reflectivity, a dam structure with higher strength can be achieved.

Reference is made to FIGS. 11A to 11D, FIGS. 11A to 11D are schematic views of various cross-sections of the dam according to the first embodiment of the present disclosure. In this embodiment, the dam 9 can have a cross-section formed by a combination of one or more of a rectangle, a triangle, a half circle, a half ellipse, and a trapezoid. For example, as shown in FIG. 11A, the cross-section of the dam 9 is an isosceles trapezoid, and the trapezoid is basically composed of a rectangle and a triangle; as shown in FIG. 11B, the cross-section of the dam 9 combines an isosceles trapezoid combined with a rectangle; as shown in FIG. 11C, the cross-section of the dam 9 combines an isosceles trapezoid with a semicircle; and as shown in FIG. 11D, the cross-section of the dam 9 is composed of two rectangles with different sizes. Therefore, it is conceivable that the dam 9 can be provided with a multi-layer stepped and inclined surface design, and thus the dam 9 is suitable for glass packaging. The dam 9 can also be applied to the substrate 1 of different materials, such as glass substrate or silicon wafer, so it can be applied to CMOS image sensor (CIS) packages.

On the other hand, since 3D printing technology and light curing technology are integrated in this embodiment to manufacture the dam 9, compared to an injection molding technology using liquid crystal polymer, the layer-by-layer stacking method can be utilized to achieve more arbitrary patterns and to exceed a limitation of aspect ratio of the existing process (which cannot reach 10, for example). Therefore, the method of the present disclosure provides better flexibility in designing the package structure, while providing numerous functionalities for components in the cavity. In one preferred embodiment of the present disclosure, the height of the dam body 9 can be within a range from 50 to 1000 μm.

In addition, in FIG. 9, the dams 9 on both sides of the first die-bonding region 111 can be integrally formed, or can be a plurality of dams formed by integrating multiple 3D printing and light curing processes, and the number of the dams 9 or the number of processes used to form the dams 9 are not limited in the present disclosure.

Reference is made to FIG. 1 again, the method proceeds to step S15: performing a second deposition process to deposit and cover a metal shielding layer on the first plate surface, the at least one dam and the first photoresist layer.

Figure 12:
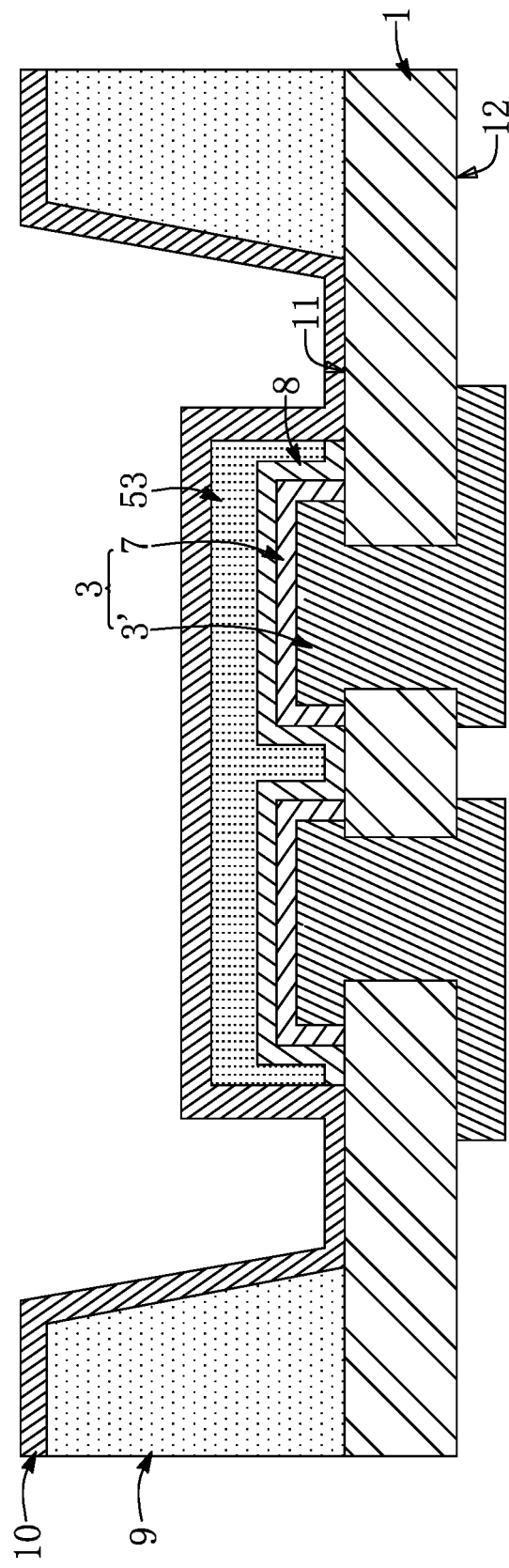
FIG. 12 is a schematic diagram showing a process of step S15 according to the first embodiment of the present disclosure.

Reference is made to FIG. 12, and FIG. 12 is a schematic diagram showing a process of step S15 according to the first embodiment of the present disclosure. As shown in FIG. 12, the second deposition process can be performed to deposit a metal shielding layer 10 on the first board surface 11, the dam 9 and the photoresist layer 53 by, for example, vacuum evaporation, ion plating, or sputtering process. In the embodiment where the chip to be packaged is a light emitting diode chip or other light emitting device, a material with high reflectivity can be selected to form the metal shielding layer 10 to improve an overall light emitting efficiency of the light emitting device. For example, a material such as silver, aluminum, gold, titanium\aluminum composite metal, nickel-gold composite metal combined with silver or nickel-palladium-gold composite metal combined with silver can be used to form the metal shielding layer 10, and the metal shielding layer 10 made of such material can be provided with reflectance more than 90% in wavelengths such as ultraviolet (200-400 nm), ultraviolet A (320-400 nm), ultraviolet B (280-320 nm), ultraviolet C (200-280 nm) and infrared (700-1000 nm).

On the other hand, when the metal shielding layer 10 is formed on the dam 9, which can be provided with anti-ultraviolet capability by utilizing the high reflectance of the metal shielding layer 10, so as to protect the dam 9 and improve its durability. Furthermore, the formed metal shielding layer 10 can enhance heat resistance and chemical resistance of the dam 9 when the dam 9 made of epoxy resin is subjected to high temperature processes applied to the chip. The metal shielding layer 10 also provides an airtight capability to address issues such as cracks and outgassing.

Step S16: performing a photoresist removal process to remove the first photoresist layer and a portion of the metal shielding layer that overlaps with the first photoresist layer.

Figure 13:
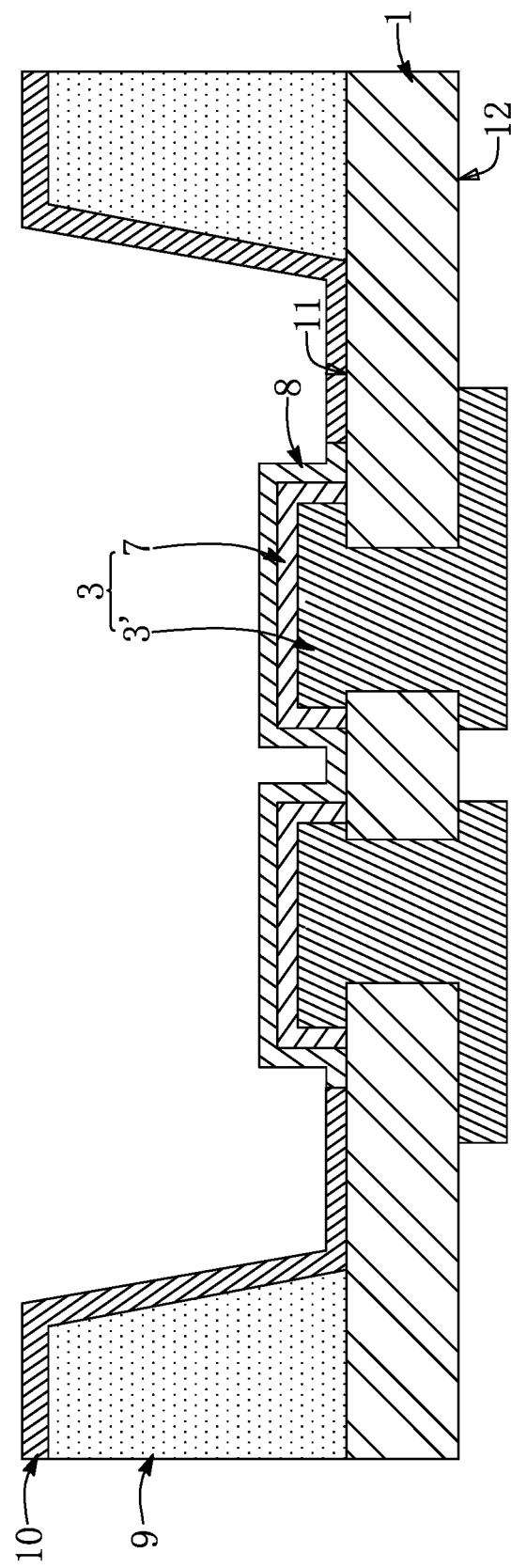
FIG. 13 is a schematic diagram showing a process of step S16 according to the first embodiment of the present disclosure.

Reference is made to FIG. 13, which is a schematic diagram showing a process of step S16 according to the first embodiment of the present disclosure. As shown in FIG. 13, the photoresist layer 53 can be removed together with a portion of the metal shielding layer 10 that covers the photoresist layer 53.

Step S17: performing a second etching process to remove the first metal seed layer to form the chip package structure.

Figure 14:
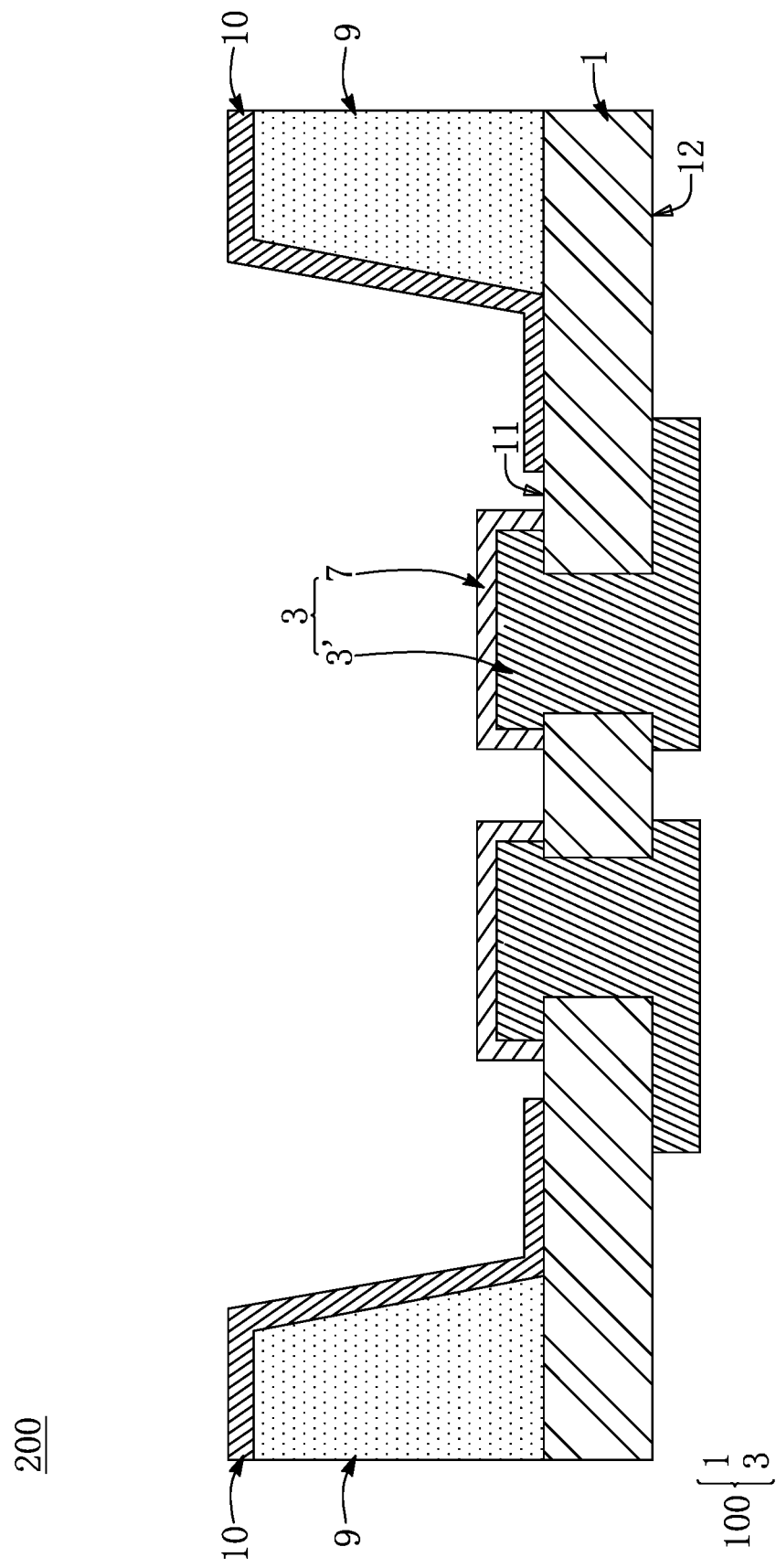
FIG. 14 is a schematic diagram showing a process of step S17 according to the first embodiment of the present disclosure.

Reference is made to FIG. 14, which is a schematic diagram showing a process of step S17 according to the first embodiment of the present disclosure. In detail, as shown in FIG. 14, chemical etching can be used to remove the first metal seed layer 8 to expose the electrodes 3. Therefore, it can be seen that the first metal seed layer 8 can be used to protect the electrodes 3 during the processes in which the dam 9 and the metal shielding layer 10 are formed. In this step, the metal shielding layer 10 can be further electrically insulated from the electrodes 3 in the first die-bonding region 111 to form the chip package structure 200.

Step S18: performing a die-bonding process to place a chip in the first die-bonding region, and electrical connect the chip with the electrodes in the first die-bonding region.

Step S19: performing a packaging process to dispose and fix a package cover to the metal shielding layer to form a chip package. The package cover CR, the dam 9 (covered with the metal shielding layer 10) and the conductive substrate 100 jointly define an enclosed space that surrounds the chip CP.

Figure 15:
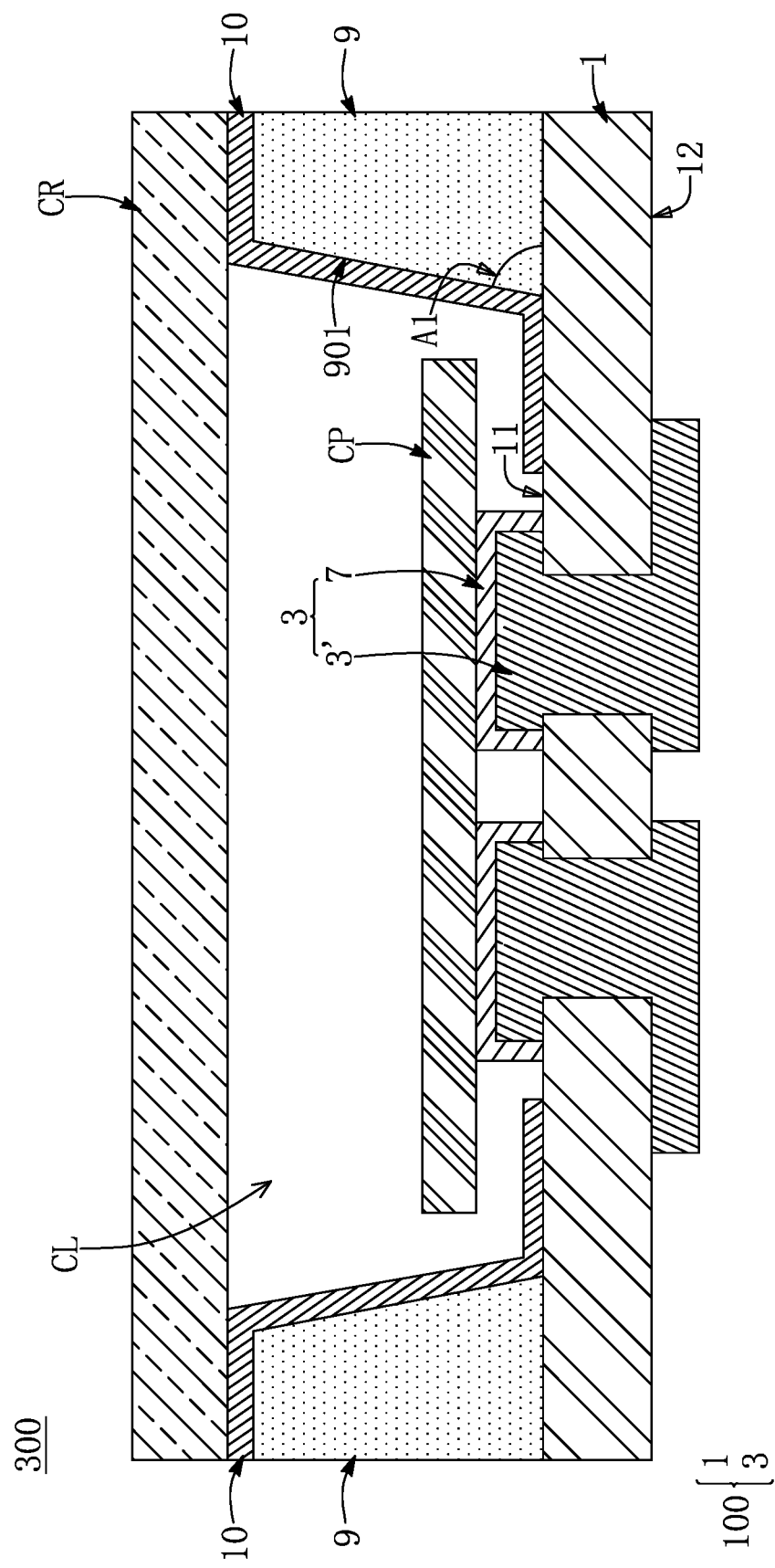
FIG. 15 is a schematic diagram showing steps S18 and S19 according to the first embodiment of the present disclosure.

For example, reference can be made to FIG. 15, which is a schematic diagram showing steps S18 and S19 according to the first embodiment of the present disclosure. As shown in FIG. 15, the chip CP can be picked up and placed on the conductive substrate 100 by controlling a robot arm, and the chip CP can be electrically connected with the electrodes 3 (for example, by welding). After electrical connections are completed, the package cover CR is picked up by a robotic arm and bonded to the dam 9 covered with the metal shielding layer 10 to form the chip package 300. Since the method for encapsulating the chip CP and the package cover CR is known to those skilled in the art, the description thereof will be omitted hereinafter. In this embodiment, a transparent cover (e.g., a glass substrate) can be used as the package cover CR, but this embodiment is not limited thereto.

It should be noted that an inner surface 901 of the dam 9 facing the chip CP is inclined at a predetermined angle A1 relative to the conductive substrate 100, such that the metal shielding layer 10 on the inner surface 901 is also inclined relative to the conductive substrate 100 at the predetermined angle A1, therefore in a case that the chip CP is the light emitting diode chip, the emitting efficiency can be improved.

Second Embodiment

Figure 16:
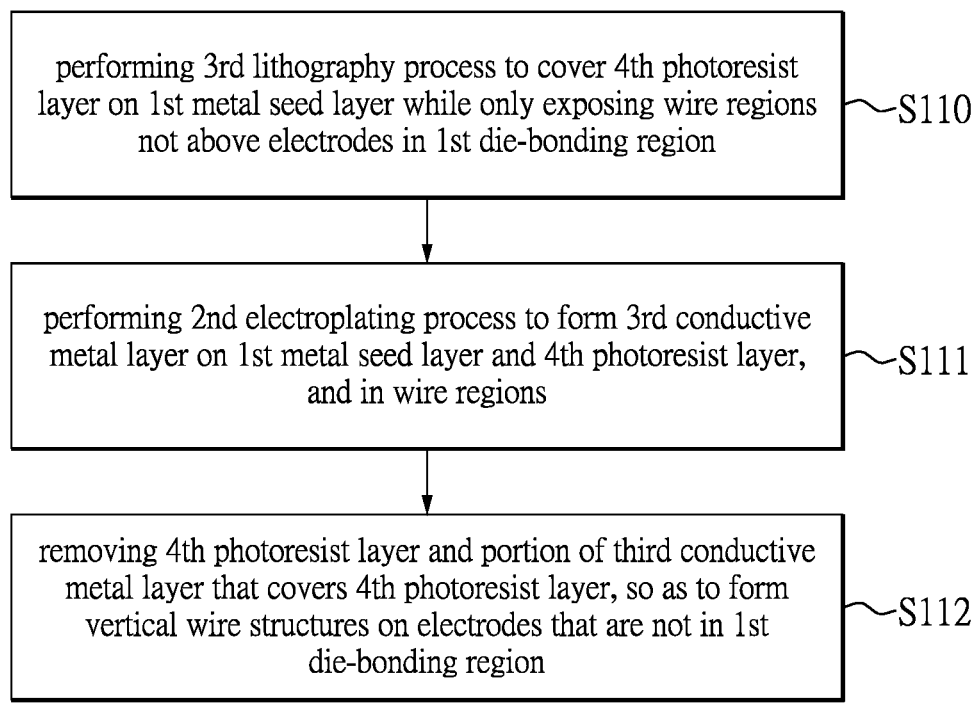
FIG. 16 is a partial flowchart of a method for fabricating a chip package structure according to a second embodiment of the present disclosure.
Figure 17:
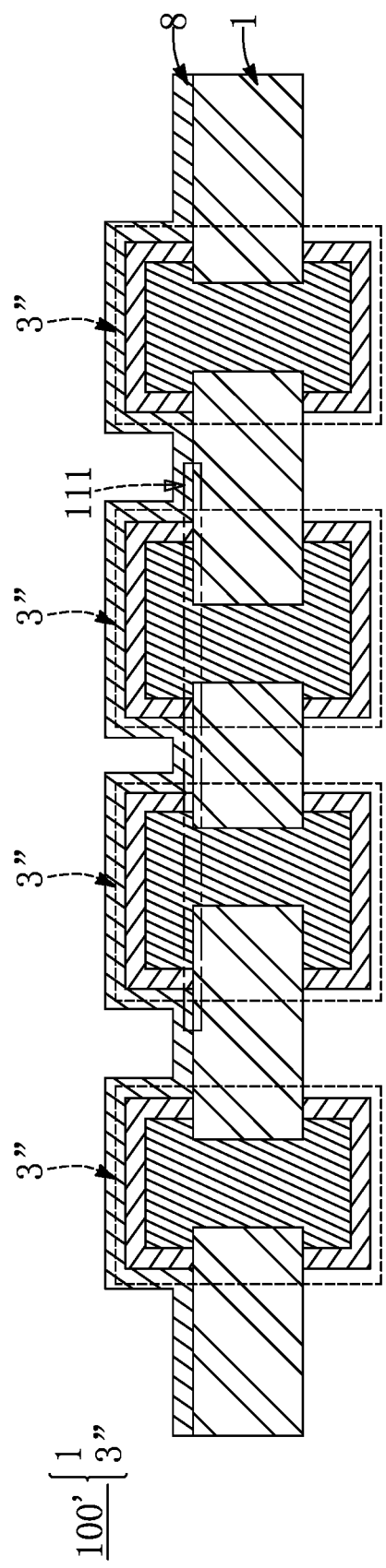
FIG. 17 is a schematic diagram showing a conductive substrate covered with a first metal seed layer according to the second embodiment of the pre sent disclosure.

FIG. 16 is a partial flowchart of a method for fabricating a chip package structure according to a second embodiment of the present disclosure, and FIG. 17 is a schematic diagram showing a conductive substrate covered with a first metal seed layer according to the second embodiment of the present disclosure. As shown in FIGS. 16 and 17, the conductive substrate 100' of this embodiment can include a plurality of electrodes 3", some of which are disposed in the first die-bonding region 111 and some of which are disposed outside the first die-bonding region 111. It should be noted that, in this embodiment, the details of the processes used are basically similar to those of the first embodiment, so repeated descriptions will be omitted hereinafter, and only differences from the first embodiment are emphasized.

As shown in FIG. 16, the method for fabricating the chip package structure further includes performing the following steps before performing step S12 of the first lithography process, that is, after the first metal seed layer 8 is deposited on the conductive substrate 100':

Step S110: performing a third lithography process to cover a fourth photoresist layer on the first metal seed layer while only exposing a plurality of wire regions not above the electrodes in the first die-bonding region.

Figure 18:
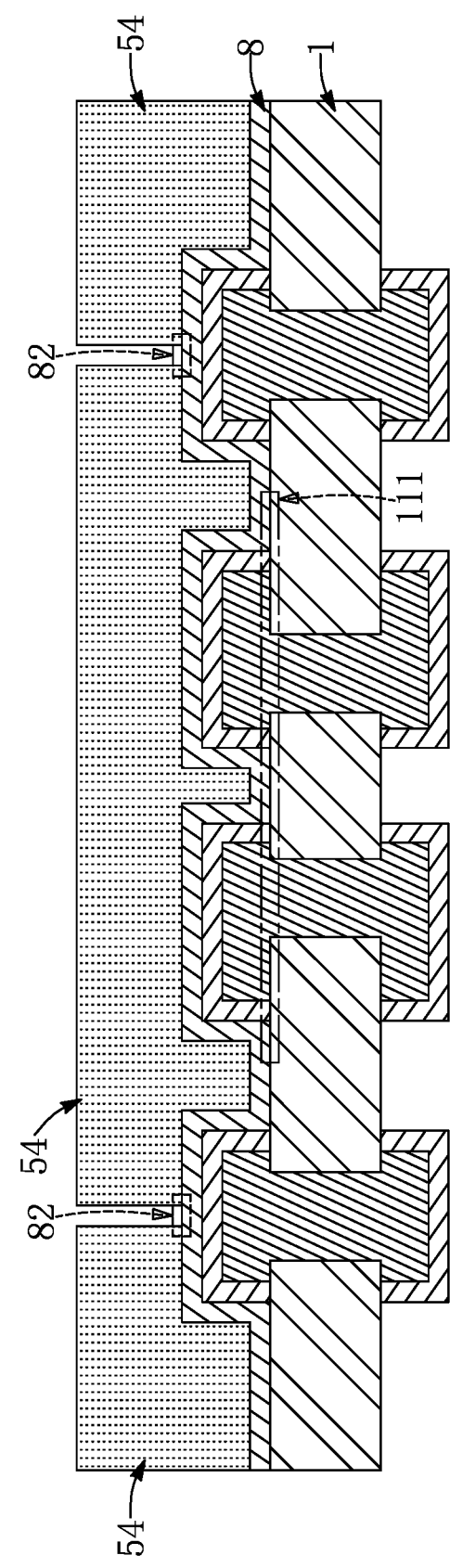
FIG. 18 is a schematic diagram showing a process of step S110 according to the second embodiment of the present disclosure.

FIG. 18 is a schematic diagram showing a process of step S110 according to the second embodiment of the present disclosure. As shown in FIG. 18, it should be noted that a wire region 82 can further provide additional electrical paths in the subsequently formed dam to the electrodes 3" that are not used for the chip (i.e., outside the first die-bonding region 111). For the above purpose, the first metal seed layer 8 is exposed in the wire region 82 to reserve a suitable conductive layer for the subsequent electroplating process used to form required circuits.

Step S111: performing a second electroplating process to form a third conductive metal layer on the first metal seed layer and the fourth photoresist layer, and in the plurality of wire regions.

Step S112: removing the fourth photoresist layer and a portion of the third conductive metal layer that covers the fourth photoresist layer, so as to form a plurality of vertical wire structures on the electrodes that are not in the first die-bonding region.

FIG. 19 is a schematic diagram of processes of steps S111 and S112 according to the second embodiment of the present disclosure. After steps S111 and S112, a structure shown in FIG. 19 is formed. A plurality of vertical wire structures 84 are formed on the electrodes 3" that are not in the first die-bonding region 111. It should be noted that the third conductive metal layer that forms the vertical wire structures 84 can be made of the same or different conductive metal material as the first metal seed layer 8, and the present disclosure is not limited thereto.

FIG. 20 is a schematic diagram showing a process after steps S12 to S17 are performed according to the second embodiment of the present disclosure. After step S112 is performed, the method for fabricating the chip package structure returns to steps S12 to S17 in FIG. 1, and a structure shown in FIG. 20 is formed. In this embodiment, when the dam 9 is formed on the electrodes 3" having the vertical wire structures 84, the dam 9 can directly cover the vertical wire structures 84 completely, and then a brushing process is performed before the dam 9 is cured to remove a portion of the dam 9 that covers the vertical wire structures 84, so as to expose a portion (e.g., a top) of the vertical wire structure 84, such that when the metal shielding layer 10 is formed in the second deposition process of step S15, it can be electrically connected with the corresponding vertical wire structure 84. Therefore, the chip package structure and the method for fabricating the same provided by the present embodiment can also realize vertically integrated packaging and shorten conductive paths provided by the wires.

Third Embodiment

Figure 21:
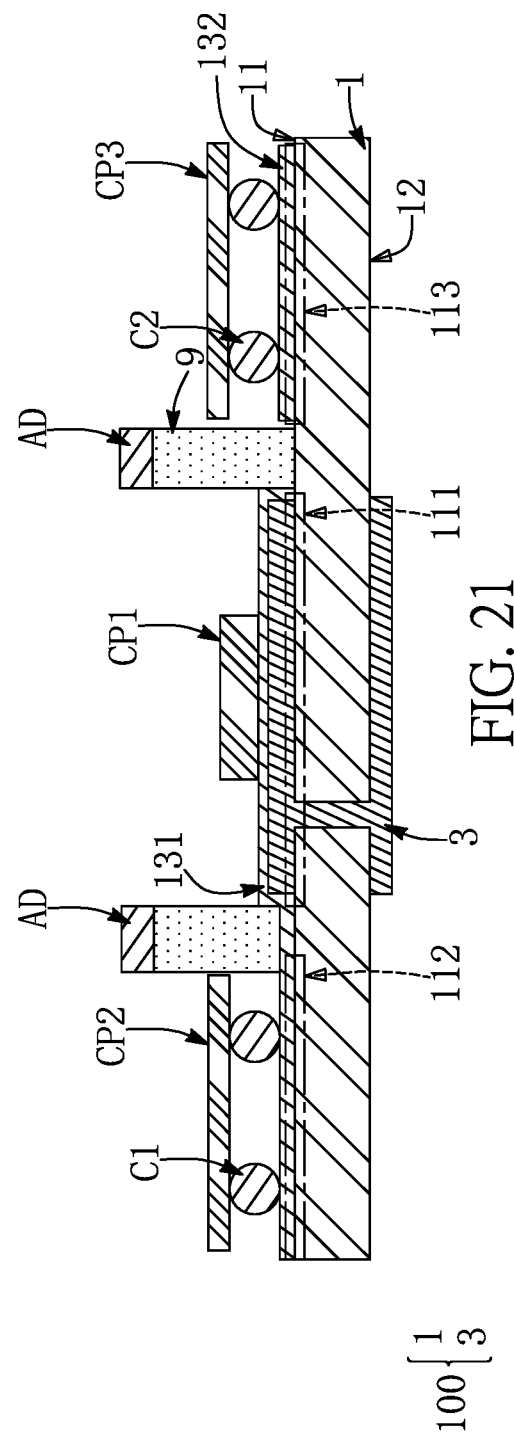
FIG. 21 is a schematic diagram of a chip package structure according to a third embodiment of the present disclosure.

Reference is made to FIG. 21, which is a schematic diagram of a chip package structure according to a third embodiment of the present disclosure. As shown in FIG. 21, the first board surface 11 includes a first die-bonding region 111, a second die-bonding region 112 and a third die-bonding region 113, chips CP1, CP2 and CP3 are disposed in the first die-bonding region 111, the second die-bonding region 112 and the third die-bonding region 113, respectively. The conductive substrate 100 further includes a circuit layer 13 disposed on the first board surface 11, and the circuit layer 13 includes a first circuit portion 131 and a second circuit portion 132.

It should be noted that, in the present embodiment, the dam 9 is different from the chip packaging structures of the first embodiment and the second embodiment in terms of application requirements. Therefore, a metal shielding layer may not be formed on the surface of the dam 9.

The first circuit portion 131 is used to provide a plurality of first conductive paths between the second die-bonding region 112 and the electrodes 3 in the first die-bonding region 111, for example, conductive paths between the electrodes 3 and a plurality of electrical contacts C1 of the chip CP2. On the other hand, the second circuit portion 132 can be used to provide a plurality of second conductive paths to the third die-bonding region 113, such as conductive paths for a plurality of electrical contacts C2 of the chip CP3. A part of the dam 9 can be disposed on the first circuit portion 131, and another part of the dam 9 can be used as an insulating layer between the first circuit portion 131 and the second circuit portion 132.

Therefore, in this embodiment, the dam 9 on the first circuit portion 131 can be in direct contact with an adhesive material AD, and since the dam 9 and the package cover body can be bonded by the adhesive material AD, a bonding force between the dam 9 and the package cover can be enhanced in subsequent steps for forming the package cover (such as the package cover CR of FIG. 15).

Fourth Embodiment

Figure 22:
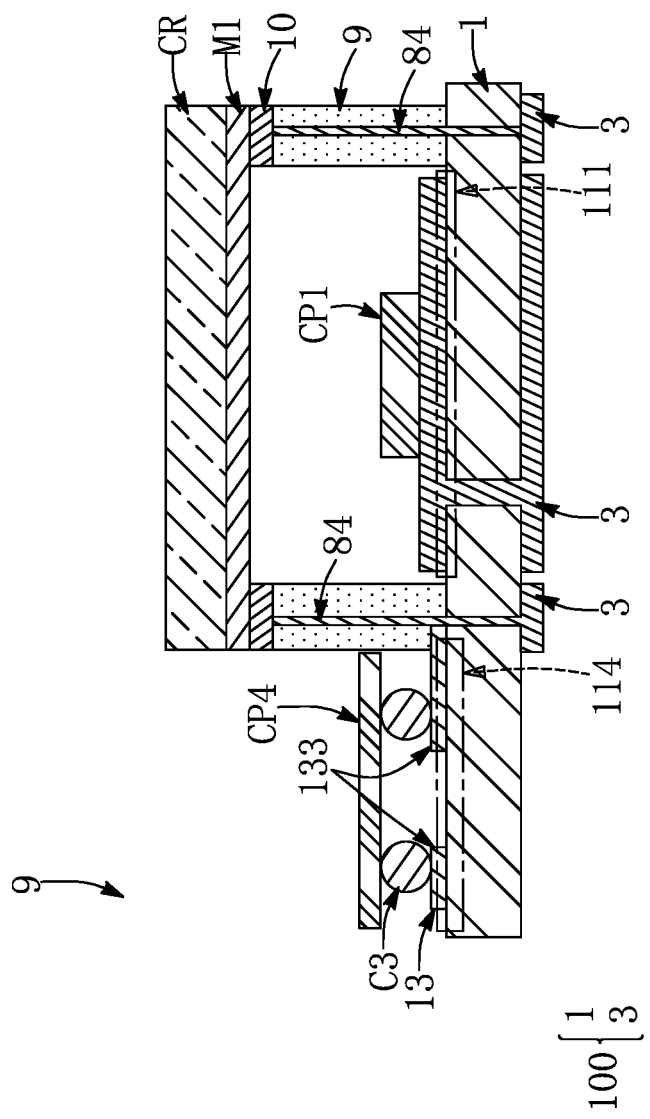
FIG. 22 is a schematic diagram of a chip package structure according to a fourth embodiment of the present disclosure.

Reference is made to FIG. 22, which is a schematic diagram of a chip package structure according to a fourth embodiment of the present disclosure. As shown in FIG. 22, the first board surface 11 includes a first die-bonding region 111 and a fourth die-bonding region 114, and the conductive substrate 100 further includes a circuit layer 13 disposed on the first board surface 11. Chips CP1 and CP4 are disposed in the first die-bonding region 111 and the fourth die-bonding region 114, respectively, and the circuit layer 13 includes a third circuit portion 133. It should be noted that, in the present embodiment, the dam 9 is different from the chip packaging structures of the first embodiment and the second embodiment in terms of application requirements. Therefore, a metal shielding layer 10 can only be formed on the surface of the dam 9.

In this embodiment, the third circuit portion 133 is used to provide a plurality of third conductive paths between the electrodes (e.g., electrical contacts C3) in the fourth die-bonding region 114 and the electrodes 3 under the dam 9. In addition, the package cover CR further includes a bridging conductive layer M1 that is in contact with the metal shielding layer, for electrically connecting the metal shielding layer 10 on a part of the dam 9 (for example, a top surface of the dam 9 on the left) with the metal shielding layer 10 on another part (e.g., the top surface of the dam 9 on the right side).

Therefore, in this embodiment, a vertical transmission path for the circuits and a horizontal transmission path bypassing the chip CP1 can be achieved, and the circuit layer 13 under the dam 9 can be protected by insulating properties of the dam 9.

Beneficial Effects of the Embodiments

In conclusion, in the package structure and the method for fabricating the same provided by the present disclosure, the 3D printing technology and the light curing technology are integrated to manufacture the dam. Therefore, by using a layer-by-layer stacking method, compared with the dispensing method used in the existing packaging technology, not only the collapse issues can be avoided, but also a cross-sectional shape of the dam can be precisely controlled to make it closer to a target shape. On the other hand, compared to an injection molding technology using liquid crystal polymer, the layer-by-layer stacking method can be utilized to achieve more arbitrary patterns and to exceed a limitation of aspect ratio of the existing process. Therefore, the method of the present disclosure provides better flexibility in designing the package structure, while providing numerous functionalities for components in the cavity.

In addition, for the light-emitting diode chip, a material with high reflectivity can be used to form the metal shielding layer, so as to improve an overall emitting efficiency of the light-emitting device chip, and the metal shielding layer made of such material can be provided with light reflectance more than 90% in ultraviolet and infrared wavelengths. Furthermore, the dam can be provided with anti-ultraviolet capability by utilizing the high reflectance of the metal shielding layer, so as to protect the dam and improve its durability. Moreover, the formed metal shielding layer can enhance heat resistance and chemical resistance of the dam when the dam made of epoxy resin is subjected to high temperature processes applied to the chip. The metal shielding layer also provides an airtight capability to address issues such as cracks and outgassing.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
    a conductive substrate, including:
        a substrate having a first board surface and a second board surface opposite to each other;
        a plurality of vias penetrating through the first board surface and the second board surface, wherein at least a part of the plurality of vias is disposed in a first die-bonding region on which a chip is to be arranged; and
        a plurality of electrodes extending from the first board surface to the second board surface through the plurality of vias, wherein each of the plurality of electrodes includes an upper electrode portion and a lower electrode portion, the upper electrode portion covers the first board surface, and the lower electrode portion covers the second board surface;
    at least one dam formed to surround the first die-bonding region and formed on the first board surface, wherein the at least one dam has a height higher than a height of the chip, and the at least one dam has an inner side surface and a top surface that is connected to the inner side surface;

a metal shielding layer covers the inner side surface and the top surface of the at least one dam and a part of the first board surface that do not overlap with the plurality of electrodes; and a package cover disposed and fixed on a part of the metal shielding layer that covers the top surface of the at least one dam and that is sandwiched between the package cover and the at least one dam.

2. The chip package structure according to claim 1, wherein the at least one dam includes a plurality of printing layers, and each of the printing layers is formed by performing a printing step and a curing step.

3. The chip package structure according to claim 1, wherein the at least one dam has a cross section formed by a combination of one or more of a rectangle, a triangle, a half circle, a half ellipse, and a trapezoid.

4. The chip package structure according to claim 1, wherein the height of the at least one dam is within a range from 50 to 1000 μm, and the at least one dam is spaced apart from at least one of the vias adjacent thereto by a distance that is at least greater than 100 μm.

5. The chip package structure according to claim 1, wherein a part of the plurality of electrodes is not in the first die-bonding region, and a plurality of vertical wire structures are respectively formed on the electrodes that are not in the first die-bonding region.

6. The chip package structure according to claim 5, wherein the at least one dam is formed on the electrodes having the vertical wire structures and exposes a part of the vertical wire structures, such that the metal shielding layer is electrically connected to the corresponding vertical wire structures when formed in the second deposition process.

7. The chip package structure according to claim 1, further comprising:

the chip that is disposed on and directly connected to the plurality of electrodes in the first die-bonding region to establish an electrical connection therebetween; and wherein the package cover, the at least one dam and the conductive substrate jointly define an enclosed space surrounding the chip, the chip is a light-emitting diode chip, the inner side surface of the at least one dam facing the chip is inclined at a predetermined angle relative to the conductive substrate, such that the metal shielding layer on the inner side surface is also inclined relative to the conductive substrate at the predetermined angle, and the package cover is a transparent cover.

* * * * *